(12) United States Patent
Kull et al.

(10) Patent No.: US 9,590,650 B1
(45) Date of Patent: Mar. 7, 2017

(54) CHARGE SHARING CIRCUIT

(71) Applicant: International Business Machines Corporation, Armonk, NY (US)

(72) Inventors: Lukas Kull, Zurich (CH); Danny Chen-Hsien Luu, Bulach (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/064,331

(22) Filed: Mar. 8, 2016

(51) Int. Cl.
*H03M 1/10* (2006.01)
*H03M 1/46* (2006.01)
*G05F 3/02* (2006.01)

(52) U.S. Cl.
CPC .............. *H03M 1/466* (2013.01); *G05F 3/02* (2013.01); *H03M 1/1009* (2013.01)

(58) Field of Classification Search
CPC ............................... H03M 1/1009; G06F 3/02
USPC .......... 341/18, 120, 155, 144, 163, 150, 153
See application file for complete search history.

(56) References Cited

U.S. PATENT DOCUMENTS

| | | | | |
|---|---|---|---|---|
| 6,037,887 A * | 3/2000 | Wu | ........................ | H03M 3/486 341/139 |
| 6,400,302 B1 * | 6/2002 | Amazeen | ............ | H03M 1/0678 341/144 |
| 6,707,403 B1 * | 3/2004 | Hurrell | ............... | H03M 1/1061 341/120 |
| 7,170,439 B1 * | 1/2007 | Chen | ................... | H03M 1/1009 341/118 |
| 7,609,570 B2 | 10/2009 | Parris et al. | | |
| 8,421,658 B1 | 4/2013 | Yau et al. | | |
| 8,436,677 B2 | 5/2013 | Kull et al. | | |
| 8,504,904 B2 | 8/2013 | Aston | | |
| 8,766,833 B1 | 7/2014 | Bogner | | |
| 2011/0122006 A1 * | 5/2011 | Liao | ..................... | H03M 1/1047 341/120 |

* cited by examiner

*Primary Examiner* — Peguy Jean Pierre
(74) *Attorney, Agent, or Firm* — Scully, Scott, Murphy & Presser, P.C.; Daniel P. Morris, Esq.

(57) ABSTRACT

A charge sharing circuit for generating a calibration voltage. The circuit comprises a calibration capacitor for providing at an upper terminal of the calibration capacitor the calibration voltage. The circuit further comprises a series connection of a plurality of N switches, wherein N is an integer>2, and a plurality of at least N−1 switching capacitors. Each switching capacitor is coupled to one connecting node connecting two of the N switches. One side of the series connection of the plurality of N switches is coupled to the upper terminal of the calibration capacitor and the other side of the series connection of the N switches is coupled to a fixed voltage. The circuit is configured to transmit at least two clock signals to selectively drive at least two distinct subsets of the switches. There is further provided a corresponding method and a corresponding design structure.

25 Claims, 8 Drawing Sheets

CHARGE SHARING CIRCUIT

BACKGROUND OF THE INVENTION

The present invention relates to a charge sharing circuit for generating a calibration voltage. The present invention further relates to a method for generating a calibration voltage and a design structure for a charge sharing circuit.

Calibration is important for electronic circuits and in particular for mixed signal circuits.

U.S. Pat. No. 8,766,833 B1 discloses a system and method for calibrating a circuit which includes coupling a first reference voltage to a first input of the circuit and coupling a programmable reference voltage to a reference node of a digital-to-analog converter (DAC) such that the gain of the DAC is dependent on an input value at the reference node.

U.S. Pat. No. 7,609,570 B2 discloses a switched capacitor charge sharing technique for integrated circuit devices according to which a switched capacitor is used to share charge between, for example, two different signals or two different groups of signals. The size of the capacitor can be adjusted to obtain the required signal level of the various signals.

Another known way to calibrate circuits is by switching a small capacitor on a large capacitor. Such a charge sharing circuit is e.g. disclosed in U.S. Pat. No. 8,436,677 B2. More particularly, U.S. Pat. No. 8,436,677 B2 discloses a design structure for a reference voltage generator. The design structure includes a first capacitor and an analog to digital converter having its voltage reference coupled to the first capacitor. The first capacitor supplies the voltage reference to the analog to digital converter. A control loop is configured to resupply charges to the first capacitor that are lost when the first capacitor supplies the voltage reference to the analog to digital converter. The granularity of the calibration depends on the ratio of the capacitance of the capacitors that can be realized in a certain technology.

It is therefore desirable to provide improved calibration circuits and associated calibration methods.

BRIEF SUMMARY OF THE INVENTION

According to a first aspect, the present invention is embodied as a charge sharing circuit for generating a calibration voltage. The circuit comprises a calibration capacitor for providing at an upper terminal of the calibration capacitor the calibration voltage. The circuit further comprises a series connection of a plurality of N switches, wherein N is an integer>2, and a plurality of at least N−1 switching capacitors. Each switching capacitor is coupled to one connecting node connecting two of the N switches. One side of the series connection of the plurality of N switches is coupled to the upper terminal of the calibration capacitor and the other side of the series connection of the N switches is coupled to a fixed voltage. The circuit is configured to transmit at least two clock signals to selectively drive at least two distinct subsets of the switches.

A charge sharing circuit according to embodiments of the invention may allow to reduce the capacity and the corresponding size of the calibration capacitor compared with a charge sharing circuit that comprises only one switching capacitor. This may be a significant advantage as capacitors may consume a large area in modern electronic circuits as they cannot be scaled in the same way as active components such as transistors. By selectively driving two distinct subsets of the switches, the calibration capacitor is not directly switched to the fixed voltage for charge sharing, but rather to an intermediate voltage level between the calibration voltage and the fixed voltage. This may result in a reduced charge transfer and an improved granularity of the calibration voltage. In other words, the charge to be shared may be considered to be divided amongst the switching capacitors.

According to a preferred embodiment the at least two clock signals are non-overlapping.

According to a further preferred embodiment the circuit is configured to generate a first one of the clock signals to drive each of the 2n+1-th switches, n=0, Floor[(N−1)/2], and a second one of the clock signals to drive each of the 2n-th switches, n=1, Ceiling[(N−1)/2].

According to such an embodiment only two clock signals are needed to drive the switches. This may minimize the number of clock signals and may provide associated advantages in terms of reduced complexity and increased area efficiency.

According to a preferred embodiment the circuit is configured to generate N clock signals and to transmit to each of the N switches one of the N clock signals.

This may allow enhanced flexibility including various switching schemes. Furthermore, the clock frequency may be lower compared with a scheme with only two clock signals.

According to another preferred embodiment each subset comprises at least two switches. According to such an embodiment the clock signals may be used to drive in parallel two or more switches. This may provide advantages in terms of reduced complexity and increased area efficiency.

According to a preferred embodiment each subset consists of one single switch.

This may allow enhanced flexibility including various switching schemes. Furthermore, the clock frequency may be lower compared with a scheme with shared clock signals.

According to a further preferred embodiment the circuit is configured to constantly close one or more of the switches and to transmit at least two non-overlapping clock signals to selectively drive at least two distinct subsets of the remaining non-constantly closed switches.

This allows to change/adapt the granularity/step size of the calibration voltage. The more switches are constantly closed, the lower the granularity. The less switches are constantly closed, the higher the granularity.

According to a further preferred embodiment a lower terminal of the calibration capacitor is coupled to a fixed voltage, one terminal of each of the switching capacitors is coupled to one connection node of the switches and the other terminal of each of the switching capacitors is coupled to a fixed voltage. The fixed voltage may generally be any potential that is fixed and hence does not change over time. The fixed voltage may be in particular a ground potential.

According to a further preferred embodiment the switching capacitors are parasitic capacitors of the switches. This may facilitate an area efficient design.

According to a further preferred embodiment the switching capacitors are separate capacitors. This may offer enhanced design flexibility. In particular, the capacity of the separate switching capacitors may be very flexibly designed.

According to a preferred embodiment the granularity Δ Vcal of the calibration voltage provided by the circuit is given by $$\Delta Vcal = Vcal \frac{Cswitch}{Ccal*(N-1)}$$

In this formula, Vcal is the calibration voltage, Cswitch is the capacitance of the switching capacitors and Ccal is the capacitance of the calibration capacitor.

This formula can preferably be used as design aid and is based on the assumption that all switches are ideal and the switching capacitors have all the same capacitance value. Furthermore, it is assumed that Ccal>>Cswitch. As can be seen from the formula, the granularity $\Delta$Vcal can be adapted by the number N−1 of switching capacitors.

The switches may preferably be embodied as PMOS transistors, NMOS transistors or as transmission gates comprising a parallel arrangement of a NMOS transistor and a PMOS transistor.

This may allow high-scale integration.

According to a preferred embodiment one or more of the switches are transmission gates comprising a parallel arrangement of a NMOS transistor and a PMOS transistor and the clock signals for driving the NMOS transistor and the PMOS transistor are skewed.

This may provide excellent switching characteristics independent of the output voltage.

According to a further preferred embodiment the other side of the series connection is coupled to ground as fixed voltage. This allows a stepwise reduction of the calibration voltage by discharging the calibration capacitor.

According to a further preferred embodiment the other side of the series connection is coupled to a supply voltage as fixed voltage. This allows a stepwise increase of the calibration voltage by charging the calibration capacitor.

According to a further preferred embodiment the circuit comprises a first series connection of a plurality of first switches and a plurality of at least N−1 first switching capacitors. Each first switching capacitor is coupled to one connecting node connecting two of the first N switches. The embodied circuit further comprises a second series connection of a plurality of second switches and a plurality of at least N−1 second switching capacitors. Each second switching capacitor is coupled to one connecting node connecting two of the second N switches. The first series connection is coupled to a first fixed voltage and the second series connection is coupled to a second fixed voltage.

Such an embodiment allows enhanced flexibility and enhanced charge sharing options. Preferably the first fixed voltage is ground and the second fixed voltage is a supply voltage.

This allows decreasing the calibration voltage by switching the first switches and the corresponding first switching capacitors, thereby removing charge from the calibration capacitor. Furthermore it allows increasing the calibration voltage by switching the second switches and the corresponding second switching capacitors, thereby adding charge to the calibration capacitor.

According to a preferred embodiment a comparator comprising a charge sharing circuit according to the first aspect is provided. The charge sharing circuit is provided for providing as calibration voltage an offset compensation voltage to the comparator.

According to a preferred embodiment a successive approximation register analog to digital converter (SAR ADC) comprising a charge sharing circuit according to the first aspect is provided. The charge sharing circuit is provided for providing as calibration voltage a reference voltage to a digital to analog converter (DAC) of the SAR ADC. Such an SAR ADC is frequently the architecture of choice for medium-to-high-resolution applications.

According to another aspect, the invention can be embodied as a method for generating a calibration voltage. The method comprises providing a charge sharing circuit. The charge sharing circuit comprises a calibration capacitor, a series connection of a plurality of N switches, wherein N is an integer>2, and a plurality of N−1 switching capacitors. Each switching capacitor is coupled to one connecting node connecting two of the N switches. One side of the series connection of the plurality of N switches is coupled to an upper terminal of the calibration capacitor and the other side of the series connection of the N switches is coupled to a fixed voltage. The method further comprises providing, by the calibration capacitor, the calibration voltage at the upper terminal of the calibration capacitor and transmitting at least two clock signals to selectively drive at least two distinct subsets of the switches. The at least two clock signals are preferably non-overlapping.

According to a preferred embodiment the method comprises generating the two clock signals to be transmitted to drive the two distinct subsets of the switches.

According to a preferred embodiment the method comprises generating a first one of the clock signals to drive each of the 2n+1-th switches, n=0, Floor[(N−1)/2], and a second one of the clock signals to drive each of the 2n-th switches, n=1, Ceiling[(N−1)/2].

According to a preferred embodiment the method comprises generating N clock signals and transmitting to each of the N switches one of the N clock signals.

According to another aspect, the invention can be embodied as a design structure tangibly embodied in a machine readable medium for designing, manufacturing, or testing an integrated circuit. The design structure comprises a charge sharing circuit for generating a calibration voltage. The circuit comprises a calibration capacitor for providing at an upper terminal of the calibration capacitor the calibration voltage. The circuit further comprises a series connection of a plurality of N switches, wherein N is an integer>2, and a plurality of at least N−1 switching capacitors. Each switching capacitor is coupled to one connecting node connecting two of the N switches. One side of the series connection of the plurality of N switches is coupled to the upper terminal of the calibration capacitor and the other side of the series connection of the N switches is coupled to a fixed voltage. The circuit is configured to transmit at least two non-overlapping clock signals to selectively drive at least two distinct subsets of the switches.

Advantages of the features of one aspect of the invention may apply to corresponding features of another aspect of the invention.

Devices and methods embodying the present invention will now be described, by way of non-limiting examples, and in reference to the accompanying drawings. Technical features depicted in the drawings are not necessarily to scale. Also some parts may be depicted as being not in contact to ease the understanding of the drawings, whereas they may very well be meant to be in contact, in operation.

BRIEF DESCRIPTION OF SEVERAL VIEWS OF THE DRAWINGS

FIG. 2b shows exemplary embodiments of clock signals corresponding to the timing diagram of FIG. 2a;

FIG. 4b shows exemplary embodiments of clock signals corresponding to the timing diagram of FIG. 4a;

DETAILED DESCRIPTION OF THE INVENTION

Figure 1:
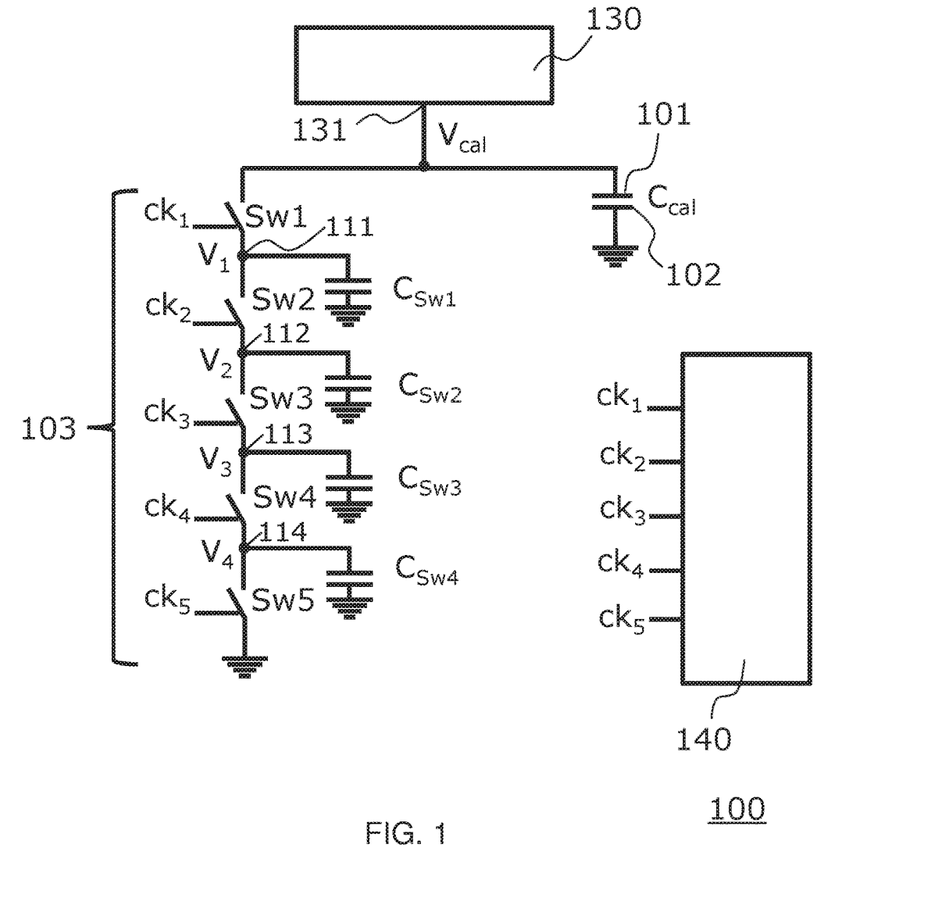
FIG. 1 is a block diagram of a charge sharing circuit for generating a calibration voltage according to an embodiment of the invention.

FIG. 1 shows an exemplary embodiment of a charge sharing circuit 100 for generating a calibration voltage $V_{cal}$. The circuit 100 comprises a calibration capacitor $C_{cal}$. The calibration capacitor $C_{cal}$ comprises an upper terminal 101 and a lower terminal 102. The upper terminal 101 of the calibration capacitor $C_{cal}$ provides the calibration voltage $V_{cal}$. The lower terminal 102 is coupled to a fixed voltage, namely to ground. The charge sharing circuit 100 further comprises a series connection 103 of a plurality of N switches. Generally N may be any integer>2. In this embodiment is N=5 and accordingly the series connection 103 comprises 5 switches Sw1, Sw2, Sw3, Sw4 and Sw5. The charge sharing circuit 100 further comprises a plurality of at least N−1 switching capacitors. As in this exemplary embodiment N=5, there are 4 switching capacitors $C_{Sw1}$, $C_{Sw2}$, $C_{Sw3}$ and $C_{Sw4}$. Each of the switching capacitors $C_{Sw1}$, $C_{Sw2}$, $C_{Sw3}$ and $C_{Sw4}$ is coupled to one connecting node connecting two of the N switches. More particularly, an upper terminal of the switching capacitor $C_{Sw1}$ is coupled to a connecting node 111, the latter connecting the first switch Sw1 with the second witch Sw2. An upper terminal of the switching capacitor $C_{Sw2}$ is coupled to a connecting node 112, the latter connecting the second switch Sw2 with the third switch Sw3. An upper terminal of the switching capacitor $C_{Sw3}$ is coupled to a connecting node 113, the latter connecting the third switch Sw3 with the fourth switch Sw4. An upper terminal of the switching capacitor $C_{Sw4}$ is coupled to a connecting node 114, the latter connecting the fourth switch Sw4 with the fifth switch Sw5. The lower terminals of the switching capacitor $C_{Sw1}$, the switching capacitor $C_{Sw2}$, the switching capacitor $C_{Sw3}$ and the switching capacitor $C_{Sw4}$ are coupled to a fixed voltage. In this embodiment the fixed voltage is ground.

The charge sharing circuit 100 provides a voltage $V_1$ at the connecting node 111, a voltage $V_2$ at the connecting node 112, a voltage $V_3$ at the connecting node 113 and a voltage $V_4$ at the connecting node 114.

One side of the series connection 103 of the plurality of N switches is coupled to the upper terminal 101 of the calibration capacitor $C_{cal}$ and the other side of the series connection 103 of the N switches is coupled to a fixed voltage. In this embodiment the fixed voltage is ground, but in general the fixed voltage can be any fixed voltage. A fixed voltage is understood as a voltage that is constant and does not change over time.

The charge sharing circuit 100 is configured to generate and transmit at least two non-overlapping clock signals to selectively drive at least two distinct subsets of the switches. More particularly, the charge sharing circuit 100 is configured to generate N=5 non-overlapping clock signals and to transmit to each of the N=5 switches one of the N non-overlapping clock signals. Hence there are N=5 subsets of switches and each subset consists of one single switch, i.e. of one of the switches Sw1, Sw2, Sw3, Sw4 or Sw5.

In this embodiment, the charge sharing circuit 100 generates and transmits 5 clock signals, namely a clock signal $ck_1$ to the first switch Sw1, a clock signal $ck_2$ to the second switch Sw2, a clock signal $ck_3$ to the third switch Sw3, a clock signal $ck_4$ to the fourth switch Sw4 and a clock signal $ck_5$ to the fifth switch Sw5. The clock signals $ck_1$, $ck_2$, $ck_3$, $ck_4$ and $ck_5$ are non-overlapping and switch the switches Sw1, Sw2, Sw3, Sw4 and Sw5 successively on and off.

The charge sharing circuit 100 provides the calibration voltage $V_{cal}$ to a device 130. The device 130 has a calibration input 131 for receiving the calibration voltage $V_{cal}$ as calibration input signal.

The device 130 may be e.g. embodied as comparator. According to such an embodiment the circuit 100 may provide as calibration voltage $V_{cal}$ an offset compensation voltage to the comparator.

The device 130 may further be embodied as successive approximation register analog to digital converter (SAR ADC). According to such an embodiment the circuit 100 may be provided for providing as calibration voltage $V_{cal}$ a reference voltage to a digital to analog converter (DAC) of the SAR ADC.

The clock signals $ck_1$, $ck_2$, $ck_3$, $ck_4$ and $ck_5$ may be generated by a control unit 140 and transmitted to the switches Sw1, Sw2, Sw3, Sw4 and Sw5 by the control unit 140. For clarity reasons the associated control lines are not drawn. The control unit 140 may also perform other control functions for the charge sharing circuit 100 and the device 130.

The switching capacitors $C_{Sw1}$, $C_{Sw2}$, $C_{Sw3}$ and $C_{Sw4}$ may be implemented as parasitic capacitors of the switches Sw1, Sw2, Sw3 and Sw4 or they may be embodied as separate capacitors.

The capacity of the calibration capacitor $C_{cal}$ is usually significantly higher than the capacity of the switching capacitors. Accordingly Ccal needs significantly more area than the switching capacitors.

The switches Sw1, Sw2, Sw3, Sw4 and Sw5 may be embodied as PMOS transistors or as NMOS transistors or as transmission gates comprising a parallel arrangement of a NMOS transistor and a PMOS transistor. According to an embodiment the switches Sw1 and Sw2 are transmission gates and the switches Sw3, Sw4 and Sw5 are NMOS transistors. The clock signals for driving the NMOS transistor and the PMOS transistor of the transmission gates are preferably skewed.

According to another embodiment the other side of the series connection 103 may be coupled to a supply voltage as fixed voltage instead of ground.

In the following the function of the charge sharing circuit 100 will be explained in more detail with reference to FIGS. 2a and 2b.

Figure 2A:
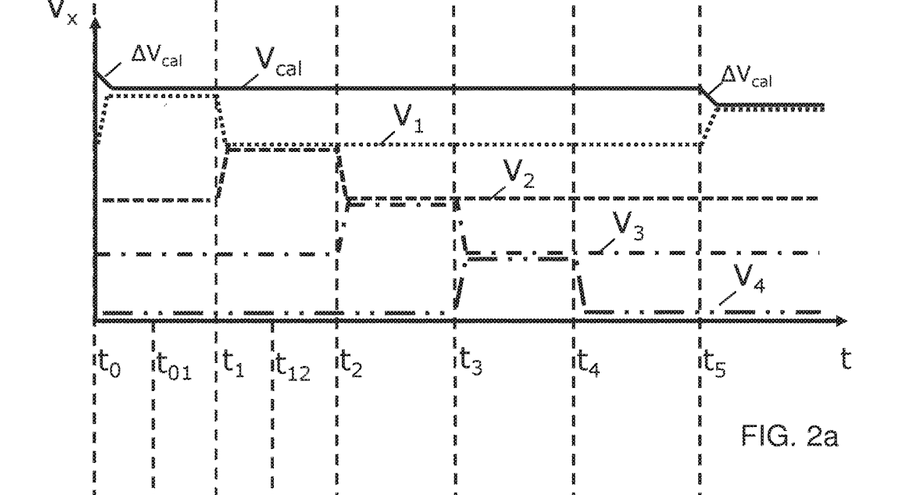
FIG. 2a shows an exemplary timing diagram of voltages at connecting nodes of the charge sharing circuit according to FIG. 1.

FIG. 2a shows an exemplary timing diagram of the calibration voltage $V_{cal}$, the voltage $V_1$ at the connecting node 111, the voltage $V_2$ at the connecting node 112, the voltage $V_3$ at the connecting node 113 and the voltage $V_4$ at the connecting node 114. The x-axis denotes the time and the y-axis denotes the voltage level.

Figure 2B:
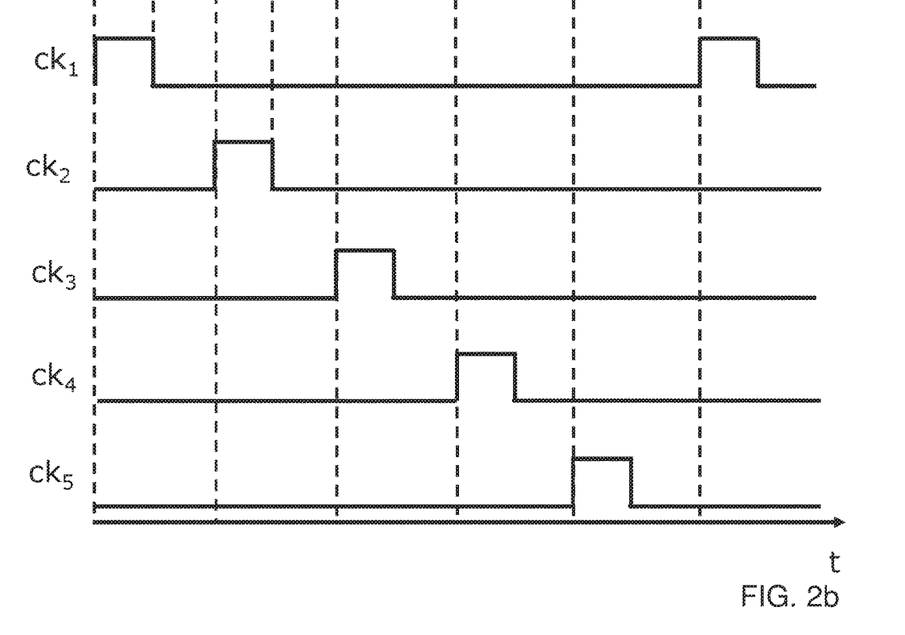

FIG. 2b shows exemplary embodiments of corresponding clock signals $ck_1$, $ck_2$, $ck_3$, $ck_4$ and $ck_5$.

The x-axis denotes the time and the y-axis denotes the voltage level.

It should be noted that the timing diagrams of FIG. 2a and FIG. 2b are schematic, simplified and not drawn to scale to illustrate the functionality of charge sharing circuits according to embodiments of the invention. In particular it should be noted that for illustrative purposes voltages of the same voltage levels are shown with a slight offset.

At a time $t_0$, the rising edge of the clock signal $ck_1$ closes the switch Sw1. Accordingly $V_1$ and $V_{cal}$ are connected together and settle at the same level. More particularly, the calibration capacitor $C_{cal}$ and the switching capacitor $C_{Sw1}$ share their charges and the calibration voltage $V_{cal}$ drops a bit by a small voltage step $\Delta$ Vcal. The voltage step $\Delta$ Vcal is rather small as the capacitance of the calibration capacitor $C_{cal}$ is significantly higher than the capacitance of the switching capacitor $C_{Sw1}$. Furthermore, the number of switching capacitors reduces the voltage step. The voltage step $\Delta$ Vcal is not drawn to scale and will usually be significantly smaller than illustrated here. As mentioned above, although $V_1$ and $V_{cal}$ have the same voltage level after the switching of Sw1, they are shown with a slight offset for illustrative purposes.

At a time $t_{01}$ the falling edge of the clock signal $ck_1$ opens the switch Sw1 and accordingly $V_1$ and $V_{cal}$ gets disconnected.

At a time $t_1$, the rising edge of the clock signal $ck_2$ closes the switch Sw2. Accordingly $V_1$ and $V_2$ are connected together and move to the same voltage level. More particularly, the switching capacitor $C_{Sw1}$ and the switching capacitor $C_{Sw2}$ share their charges. Assuming that the capacities of the switching capacitors $C_{Sw1}$ and $C_{Sw2}$ are the same, the voltage levels of $V_1$ and $V_2$ settle in the middle between the voltage levels of $V_1$ and $V_2$ before the switching of Sw2. In other words, $$V_1(t_{12})=V_2(t_{12})=(V_1(t_{01})+V_2(t_{01}))/2,$$

wherein $V_1$ ($t_{12}$) and $V_2$ ($t_{12}$) are the voltage values of $V_1$ and $V_2$ at a time $t_{12}$ after switching of Sw2 and $V_1(t_{01})$ and $V_2(t_{01})$ are the voltage values of $V_1$ and $V_2$ at a time $t_{01}$ before switching of Sw2.

At a time $t_{12}$ the falling edge of the clock signal $ck_2$ opens the switch Sw2 and accordingly $V_1$ and $V_2$ get disconnected.

Next, at a time $t_2$, the rising edge of the clock signal $ck_3$ closes the switch Sw3. Accordingly $V_2$ and $V_3$ are connected together and move to the same level. In a corresponding manner as described above, the switching capacitor $C_{Sw2}$ and the switching capacitor $C_{Sw3}$ share their charges. Assuming again that the capacities of the switching capacitors $C_{Sw2}$ and $C_{Sw3}$ are the same, the voltage levels of $V_2$ and $V_3$ settle in the middle between the voltage levels of $V_2$ and $V_3$ before the switching of Sw2. Subsequently the falling edge of the clock signal $ck_3$ opens the switch Sw3 and accordingly $V_2$ and $V_3$ get disconnected.

Next, at a time $t_3$, the rising edge of the clock signal $ck_4$ closes the switch Sw4. Accordingly $V_3$ and $V_4$ are connected together and move to the same level. In a corresponding manner as described above, the switching capacitor $C_{Sw3}$ and the switching capacitor $C_{Sw4}$ share their charges. Assuming again that the capacities of the switching capacitors $C_{Sw3}$ and $C_{Sw4}$ are the same, the voltage levels of $V_3$ and $V_4$ settle in the middle between the voltage levels of $V_3$ and $V_4$ before the switching of Sw4. Subsequently the falling edge of the clock signal $ck_4$ opens the switch Sw4 and accordingly $V_3$ and $V_4$ get disconnected.

Next, at a time $t_4$, the rising edge of the clock signal $ck_5$ closes the switch Sw5. Accordingly $V_4$ and $V_5$ are connected together and move to the same level. In a corresponding manner as described above, the switching capacitor $C_{Sw4}$ and the switching capacitor $C_{Sw5}$ share their charges. Assuming again that the capacities of the switching capacitors $C_{Sw4}$ and $C_{Sw5}$ are the same, the voltage levels of $V_4$ and $V_5$ settle in the middle between the voltage levels of $V_4$ and $V_5$ before the switching of Sw5. Subsequently the falling edge of the clock signal $ck_5$ opens the switch Sw5 and accordingly $V_4$ and $V_5$ get disconnected.

Then at a time $t_5$ the above described cycle may start again and the calibration voltage $V_{cal}$ may again be reduced by a voltage step $\Delta$ Vcal.

Figure 3:
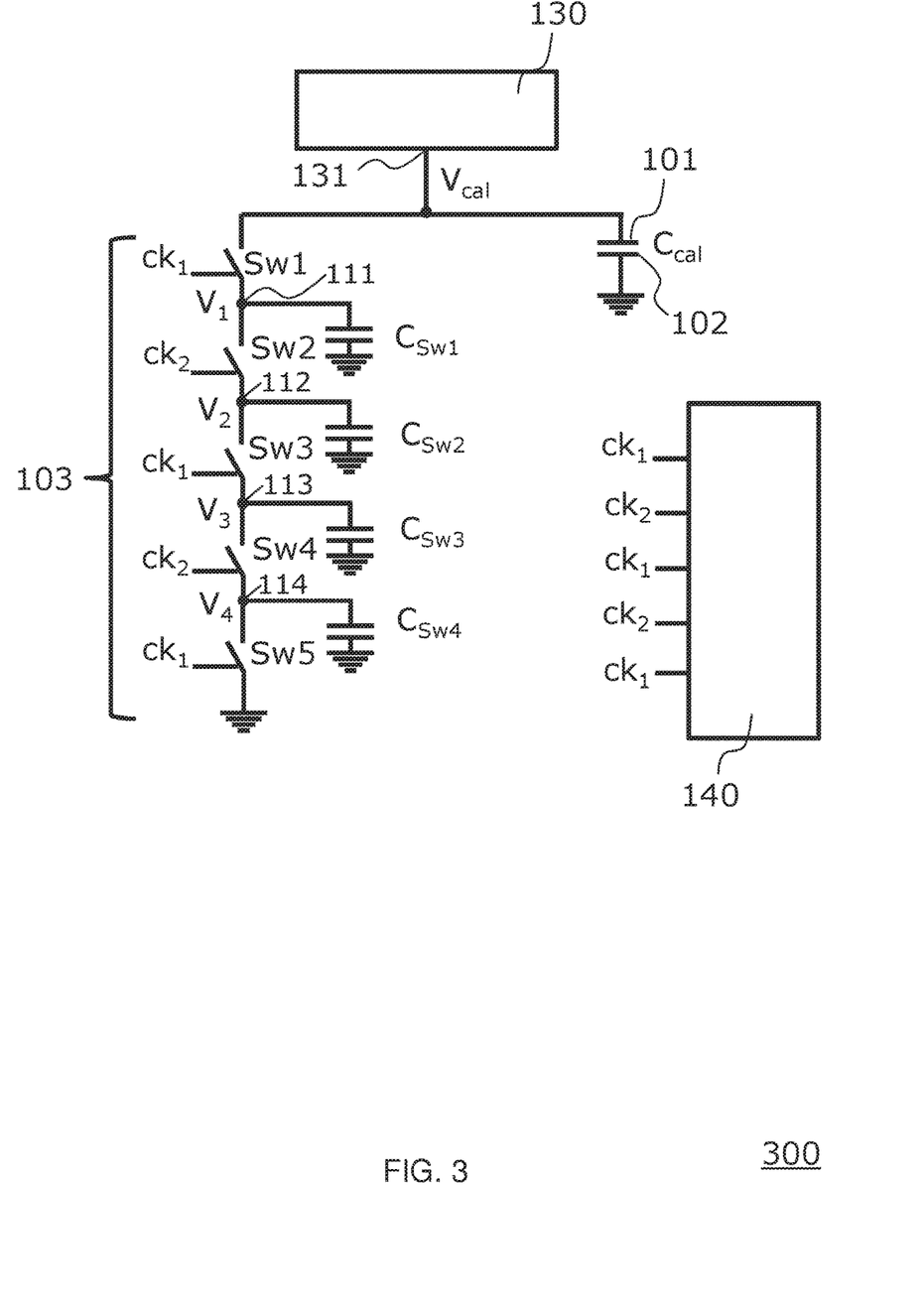
FIG. 3 is a block diagram of a charge sharing circuit for generating a calibration voltage according to another embodiment of the invention.

FIG. 3 shows another exemplary embodiment of a charge sharing circuit 300 for generating a calibration voltage $V_{cal}$. According to this embodiment two subsets of switches are provided and each subset comprises at least two switches. More particularly, a first subset comprises switches Sw1, Sw3 and Sw5 and a second subset comprises switches Sw2 and Sw4. The switches Sw1, Sw3 and Sw5 of the first subset are driven by a first clock signal $ck_1$ and the switches Sw2 and Sw4 of the second subset are driven by a second clock signal $ck_2$ Accordingly, in a generalized way, the first clock signal $ck_1$ drives each of the 2n+1-th switches, n=0, Floor [(N−1)/2], and a the second clock signal $ck_2$ drives each of the 2n-th switches, n=1, Ceiling [(N−1)/2].

In the following the function of the charge sharing circuit 300 will be explained in more detail with reference to FIGS. 4a and 4b.

Figure 4A:
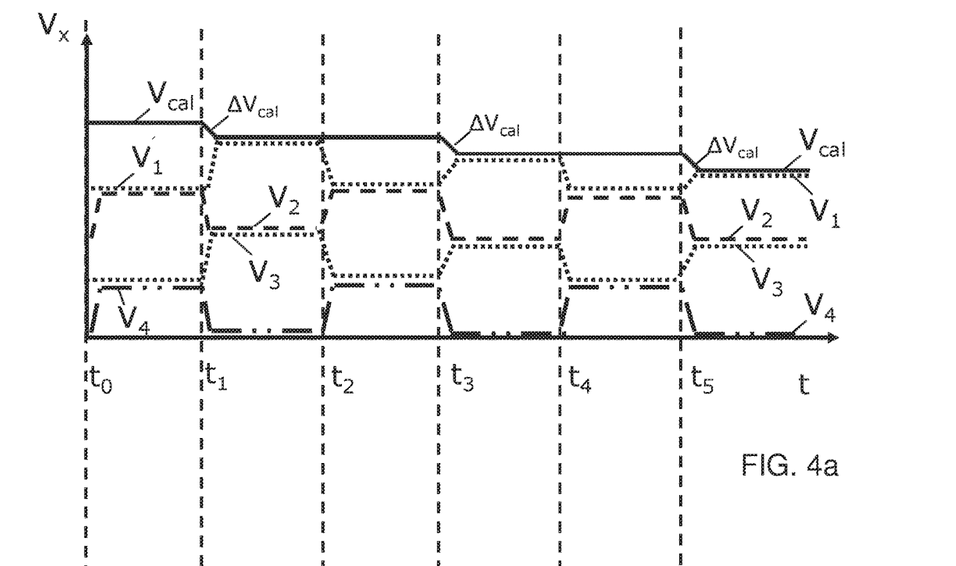
FIG. 4a shows an exemplary timing diagram of voltages at connecting nodes of the charge sharing circuit according to FIG. 3.

FIG. 4a shows an exemplary timing diagram of the calibration voltage $V_{cal}$, the voltage $V_1$ at the connecting node 111, the voltage $V_2$ at the connecting node 112, the voltage $V_3$ at the connecting node 113 and the voltage $V_4$ at the connecting node 114. The x-axis denotes the time and the y-axis denotes the voltage level.

FIG. 2b shows exemplary embodiments of corresponding clock signals $ck_1$ and $ck_2$.

The x-axis denotes the time and the y-axis denotes the voltage level.

Figure 4B:
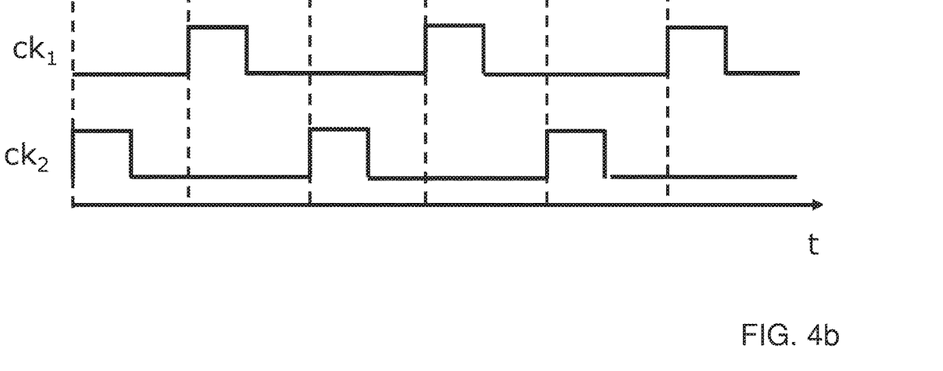

It should again be noted that the timing diagrams of FIG. 4a and FIG. 4b are schematic, not drawn to scale and simplified to illustrate the functionality of the charge sharing circuit 300. In particular it should be noted that for illustrative purposes voltages of the same voltage level are shown with a slight offset.

At a time $t_1$, the rising edge of the clock signal $ck_1$ closes concurrently the switches Sw1, Sw3 and Sw5. Accordingly $V_1$ and $V_{cal}$ are connected together and settle at the same level. More particularly, the calibration capacitor $C_{cal}$ and the switching capacitor $C_{Sw1}$ share their charges and the calibration voltage $V_{cal}$ drops a bit by a voltage step $\Delta$ Vcal. As mentioned above, although $V_1$ and $V_{cal}$ have the same voltage level, they are shown with a slight offset for illustrative purposes. Furthermore, the voltage step $\Delta$ Vcal is not drawn to scale and will usually be significantly smaller than illustrated here.

Furthermore, $V_2$ and $V_3$ are connected together and move to the same level. More particularly, the switching capacitor $C_{Sw2}$ and the switching capacitor $C_{Sw3}$ share their charges. Assuming that the capacities of the switching capacitors $C_{Sw2}$ and $C_{Sw3}$ are the same, the voltage levels of $V_2$ and $V_3$ settle in the middle between the voltage levels of $V_2$ and $V_3$ before the switching of Sw3. In addition, V4 is connected via the switch Sw5 to ground.

Subsequently, the falling edge of the clock signal $ck_1$ opens the switches Sw1, Sw3 and Sw5 and accordingly $V_1$ and $V_{cal}$, $V_2$ and $V_3$ as well as $V_4$ and ground get disconnected from each other.

Next, at a time $t_2$, the rising edge of the clock signal $ck_2$ closes the switches Sw2 and Sw4. Accordingly $V_1$ and $V_2$ as well as $V_3$ and $V_4$ are concurrently connected together and move to the same level respectively. In a corresponding manner as described above, the switching capacitor $C_{Sw1}$ and the switching capacitor $C_{Sw2}$ share their charges. Assuming again that the capacity of the switching capacitors $C_{Sw1}$ and $C_{Sw2}$ are the same, the voltage levels of $V_1$ and $V_2$ settle in the middle between the voltage levels of $V_1$ and $V_2$ before the switching of Sw2. In a corresponding manner the voltage levels of $V_3$ and $V_4$ settle in the middle between the voltage levels of $V_3$ and $V_4$ before the switching of Sw2.

Subsequently the falling edge of the clock signal $ck_2$ opens the switches Sw2 and Sw4 and accordingly $V_1$ and $V_2$ as well as $V_3$ and $V_4$ get disconnected.

Then at a time $t_3$ the above described cycle may start again and the calibration voltage $V_{cal}$ may again be reduced by a voltage step $\Delta$ Vcal.

Assuming that all switches Sw1, Sw2, Sw3, Sw4 and Sw5 are ideal, that the capacity of all capacitors $C_{Sw1}$, $C_{Sw2}$, $C_{Sw3}$ and $C_{Sw4}$ is equal and that the capacity of $C_{cal}$ is significantly higher than the capacity of $C_{Sw1}$, $C_{Sw2}$, $C_{Sw3}$ and $C_{Sw4}$, the voltage $V_1$ will settle according to this embodiment at approximately $3*V_{cal}/4$, the voltage $V_2$ will settle at approximately $V_{cal}/2$ and the voltage $V_3$ at approximately $V_{cal}/4$.

Hence the switching capacitor $C_{sw1}$ is switched between $V_{cal}$ and $3*V_{cal}/4$. In general terms, it is switched to an intermediate node. As a result, the charge taken from $C_{cal}$ is smaller compared with a switching to ground. By increasing the number of switching capacitors, the size of the large calibration capacitor $C_{cal}$ can be reduced by N-1. This is in particular advantageous for designs that cannot use deep trench capacitors.

Figure 5:
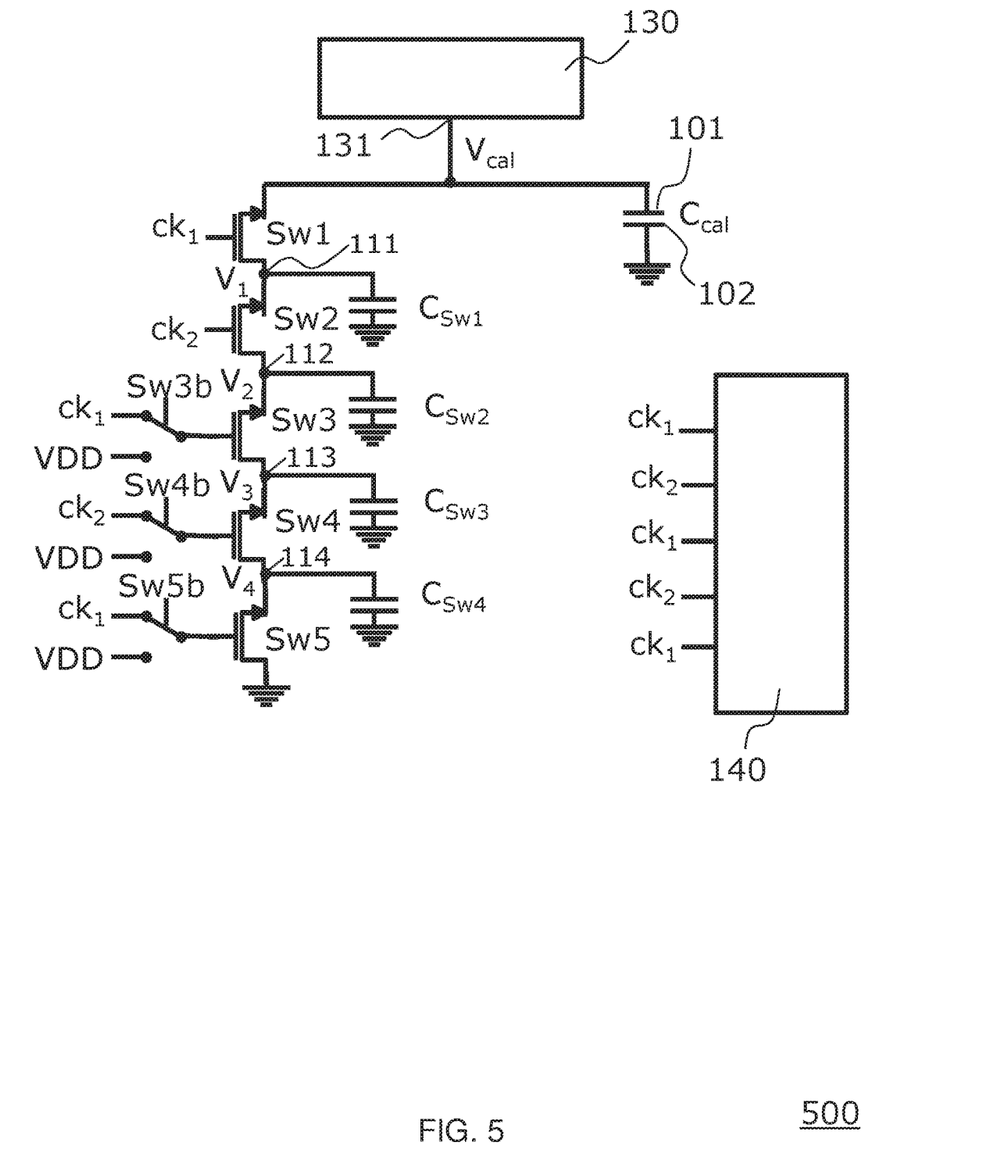
FIG. 5 shows another exemplary embodiment of a charge sharing circuit for generating a calibration voltage.

FIG. 5 shows another exemplary embodiment of a charge sharing circuit 500 for generating a calibration voltage $V_{cal}$. The circuit 500 provides the option to constantly close one or more of the switches Sw3, Sw4 and Sw5. According to embodiments a constant close of a switch is understood as a close for a predefined period of time during which the associated switch is not driven by the corresponding clock signal. This allows to change or adapt respectively the granularity $\Delta$ Vcal of the calibration voltage, i.e. the size of the switchable voltage step. In the charge sharing circuit 500 the switches Sw1, Sw2, Sw3, Sw4 and Sw5 are implemented as transistors. To enable a constant or permanent close of the switches Sw3, Sw4 and Sw5, the circuit 500 comprises a switch Sw3b that is coupled to the gate of the switch Sw3, a switch Sw4b that is coupled to the gate of the switch Sw4 and a switch Sw5b that is coupled to the gate of the switch Sw5. The switches Sw3b, Sw4b and Sw5b can be switched by the control unit 140 between the respective clock signals ck1, ck2 and VDD. If the switches Sw3b, Sw4b and/or Sw5b are switched to VDD, the corresponding switches Sw3, Sw4 or Sw5 are constantly closed. If Sw5 is constantly closed, the switching capacitor $C_{Sw4}$ is disabled. If Sw5 and Sw4 are constantly closed, the switching capacitors $C_{Sw4}$ and $C_{Sw3}$ are disabled. If Sw5, Sw4 and Sw3 are constantly closed, the switching capacitors $C_{Sw4}$, $C_{Sw3}$ and $C_{Sw2}$ are disabled. As the voltage step depends in an inverse manner on the number of switching capacitors $C_{Sw}$ that participate in the charge sharing, the adjustable voltage step is smallest if all capacitors $C_{Sw4}$, $C_{Sw3}$, $C_{Sw2}$ and $C_{Sw1}$ participate in the charge sharing. The adjustable voltage step is highest if only $C_{Sw1}$ participates in the charge sharing, i.e. if the switches Sw3b, Sw4b and Sw5b are switched to VDD.

If one assumes that all switches Sw1, Sw2, Sw3, Sw4 and Sw5 are ideal and that the switching capacitors $C_{Sw4}$, $C_{Sw3}$, $C_{Sw2}$ and $C_{Sw1}$ have all the same capacitance value, the adjustable voltage step size/granularity $\Delta$ Vcal may be estimated by the following formula:

$$\Delta Vcal = Vcal \frac{Cswitch}{Ccal*(N-1)}$$

In this formula, Vcal is the calibration voltage, Cswitch is the capacitance of the switching capacitors, e.g. of $C_{Sw4}$, $C_{Sw3}$, $C_{Sw2}$ and $C_{Sw1}$ and Ccal is the capacitance of the calibration capacitor $C_{cal}$. Furthermore, it is assumed that Ccal>>Cswitch. As can be seen from the formula, the granularity $\Delta$ Vcal can be adapted by the number N-1 of switching capacitors. To achieve the same small $\Delta$ Vcal, a large N results in a smaller $C_{cal}$.

Figure 6:
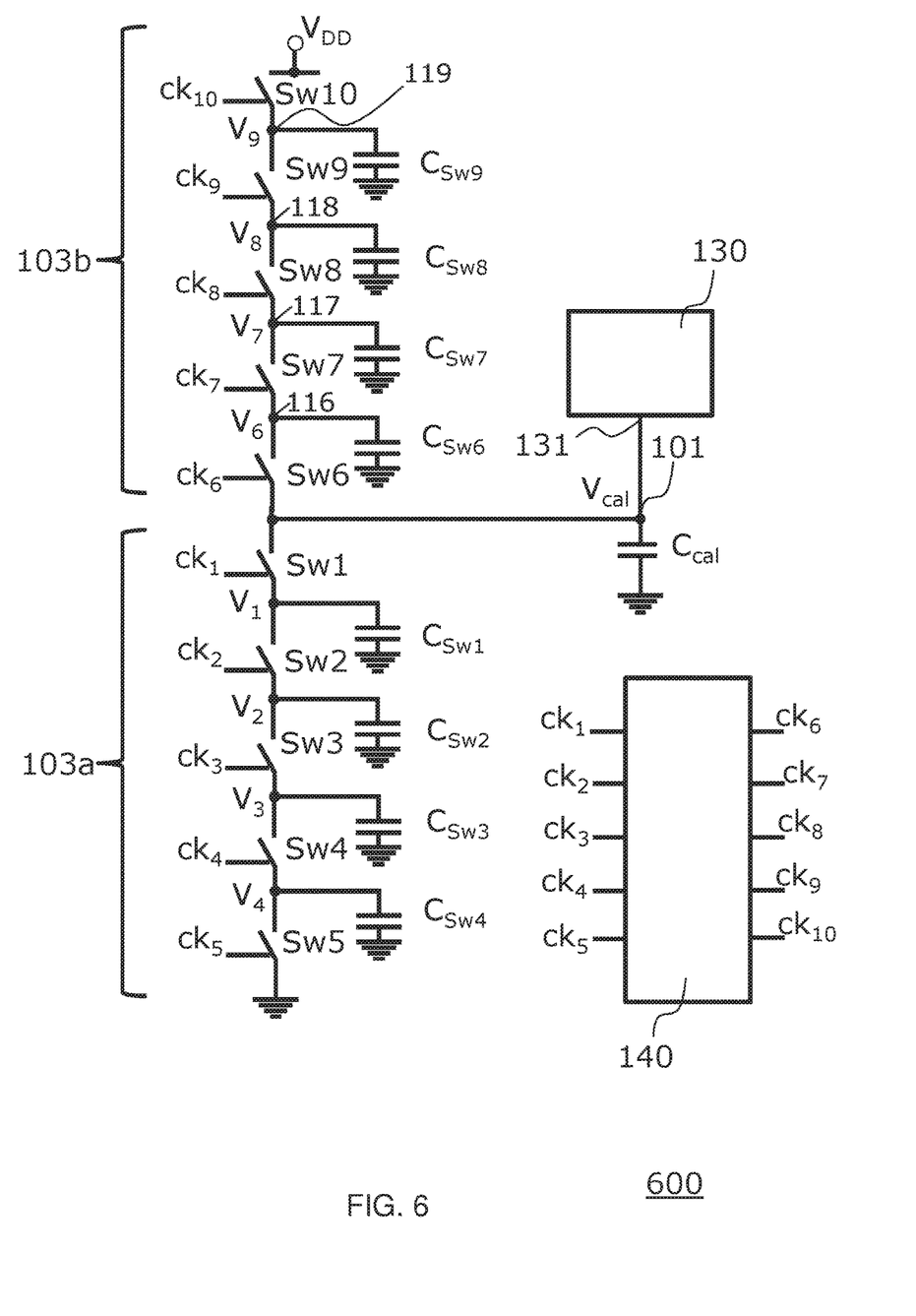
FIG. 6 shows another exemplary embodiment of a charge sharing circuit for generating a calibration voltage.

FIG. 6 shows another exemplary embodiment of a charge sharing circuit 600 for generating a calibration voltage $V_{cal}$.

The charge sharing circuit 600 comprises a first series connection 103a of a plurality of first switches Sw1, Sw2, Sw3, Sw4 and Sw5 and a plurality of N-1=4 first switching capacitors $C_{Sw1}$, $C_{Sw2}$, $C_{Sw3}$ and $C_{Sw4}$.

One side of the first series connection 103a is coupled to the upper terminal 101 of the calibration capacitor $C_{cal}$ and the other side of the first series connection 103a is coupled to a first fixed voltage, namely to ground.

The first series connection 103a may be generally embodied in the same way as the series connection 103 as illustrated with reference to FIG. 1.

The charge sharing circuit 500 comprises a second series connection 103b of a plurality of second switches Sw6, Sw7, Sw8, Sw9 and Sw10 and a plurality of N-1=4 second switching capacitors $C_{Sw6}$, $C_{Sw7}$, $C_{Sw8}$ and $C_{Sw9}$.

One side of the second series connection 103b is coupled to the upper terminal 101 of the calibration capacitor $C_{cal}$ and the other side of the second series connection 103b is coupled to a second fixed voltage, namely the supply voltage VDD.

Each of the switching capacitors $C_{Sw6}$, $C_{Sw7}$, $C_{Sw8}$ and $C_{Sw9}$ is coupled to one connecting node connecting two of the N switches. More particularly, an upper terminal of the switching capacitor $C_{Sw6}$ is coupled to a connecting node 116, the latter connecting the switch Sw6 with the switch Sw7. An upper terminal of the switching capacitor $C_{Sw7}$ is coupled to a connecting node 117, the latter connecting the switch Sw7 with the switch Sw8. An upper terminal of the switching capacitor $C_{Sw8}$ is coupled to a connecting node 118, the latter connecting the switch Sw8 with the switch Sw9. An upper terminal of the switching capacitor $C_{Sw9}$ is coupled to a connecting node 119, the latter connecting the switch Sw9 with the switch Sw10. The lower terminals of the switching capacitors $C_{Sw6}$, $C_{Sw7}$, $C_{Sw8}$ and $C_{Sw9}$ are coupled to a fixed voltage, namely to ground.

A control unit 140 of the charge sharing circuit 600 is configured to generate and transmit a first set of 5 clock signals, namely a clock signal $ck_1$ to the switch Sw1, a clock signal $ck_2$ to the switch Sw2, a clock signal $ck_3$ to the switch Sw3, a clock signal $ck_4$ to the switch Sw4 and a clock signal $ck_5$ to the switch Sw5. The clock signals $ck_1$, $ck_2$, $ck_3$, $ck_4$ and $ck_5$ are non-overlapping and switch the switches Sw1, Sw2, Sw3, Sw4 and Sw5 successively on and off.

The control unit 140 of the charge sharing circuit 600 is further configured to generate and transmit a second set of 5 clock signals, namely a clock signal $ck_6$ to the switch Sw6, a clock signal $ck_7$ to the switch Sw7, a clock signal $ck_8$ to the switch Sw8, a clock signal $ck_9$ to the switch Sw9 and a clock signal $ck_{10}$ to switch Sw10. The clock signals $ck_6$, $ck_7$, $ck_8$, $ck_9$ and $ck_{10}$ are non-overlapping and switch the switches Sw6, Sw7, Sw8, Sw9 and Sw10 successively on and off.

The charge sharing circuit 600 allows regulating the calibration voltage $V_{cal}$ in two directions.

More particularly, the calibration voltage $V_{cal}$ may be decreased by switching the first switches Sw1, Sw2, Sw3, Sw4 and Sw5 of the first series connection 103a according to a cycle as described above e.g. with reference to FIG. 1. Thereby charge is removed from the calibration capacitor $C_{cal}$, namely by transferring a piece of charge from the calibration capacitor $C_{cal}$ to the switching capacitor $C_{Sw1}$. Similarly, the calibration voltage $V_{cal}$ may be increased by switching the second switches Sw6, Sw7, Sw8, Sw9 and Sw10 of the second series connection. Thereby the second capacitors are charged via the supply voltage VDD. Accordingly, charge can be added to the calibration capacitor $C_{cal}$, namely by transferring a piece of charge from the switching capacitor $C_{Sw6}$ to the calibration capacitor $C_{cal}$.

Figure 7:
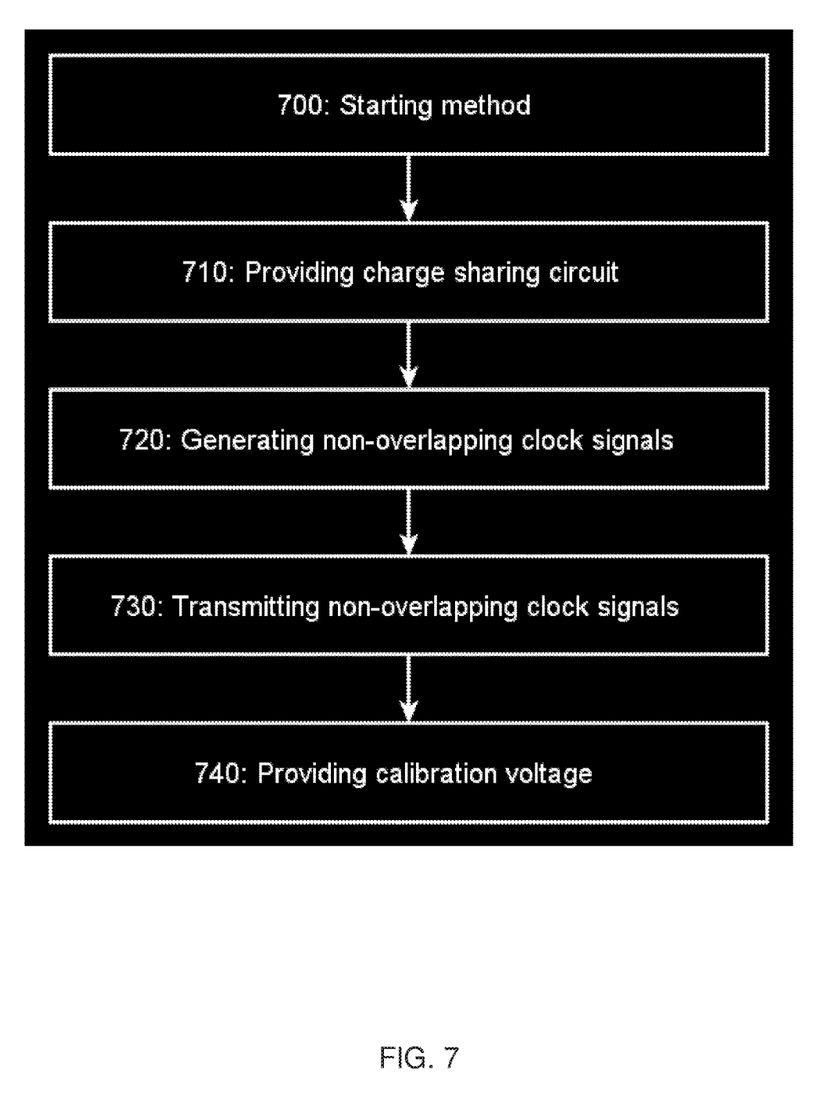
FIG. 7 shows a flow chart of a method for generating a calibration voltage according to an embodiment of the invention.

FIG. 7 shows a flowchart of method steps of a method for generating a calibration voltage $V_{cal}$.

At a step 700, the method is started.

At a step 710, a charge sharing circuit is provided. The charge sharing circuit may be e.g. embodied as the circuits 100, 300, 500 or 600 as described above.

At a step 720, at least two non-overlapping clock signals are generated, e.g. by the controller 140.

According to one embodiment the step 720 may comprise generating a first one of the clock signals to drive each of the 2n+1-th switches, n=0, Floor[(N−1)/2], and a second one of the clock signals to drive each of the 2n-th switches, n=1, Ceiling[(N−1)/2]. According to another embodiment the step 720 may comprise generating N non-overlapping clock signals.

At a step 730, the two non-overlapping clock signals are transmitted to the switches to selectively drive at least two distinct subsets of the switches.

At a step 740, the calibration voltage is provided at an upper terminal of the calibration capacitor.

Figure 8:
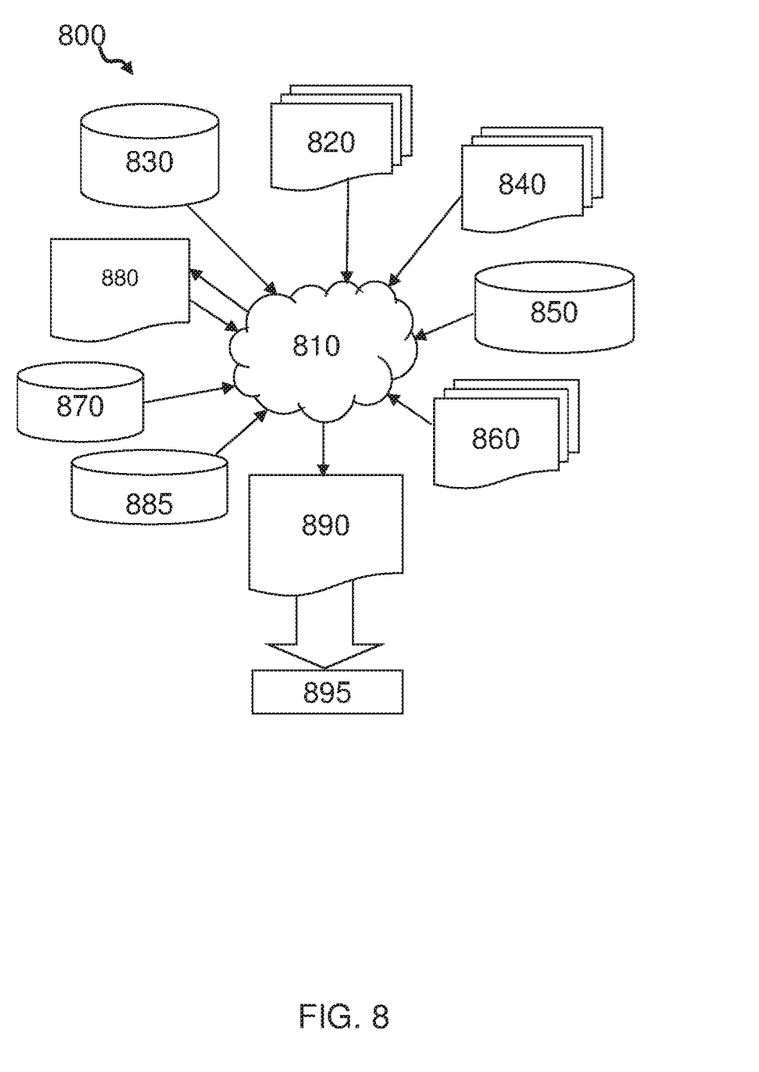
FIG. 8 is a flow diagram of a design process used in semiconductor design, manufacture, and/or test.

FIG. 8 shows a block diagram of an exemplary design flow 800 used for example, in semiconductor IC logic design, simulation, test, layout, and manufacture. Design flow 800 includes processes, machines and/or mechanisms for processing design structures or devices to generate logically or otherwise functionally equivalent representations of the design structures and/or devices described above and shown e.g. in FIGS. 1, 3, 5 and 6. The design structures processed and/or generated by design flow 800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown in FIGS. 1, 3, 5 and 6. As such, design structure 820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in FIGS. 1, 3, 5 and 6 to generate a Netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 810 may include hardware and software modules for processing a variety of input data structure types including Netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885 which may include input test patterns, output test results, and other testing information. Design process 810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 810 without deviating from the scope and spirit of the invention. Design process 810 may also include modules for performing standard circuit design processes such as timing analysis, verification, design rule checking, place and route operations, etc.

Design process 810 employs and incorporates logic and physical design tools such as HDL compilers and simulation model build tools to process design structure 820 together with some or all of the depicted supporting data structures along with any additional mechanical design or data (if applicable), to generate a second design structure 890. Design structure 890 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 3, 5 and 6. In one embodiment, design structure 890 may comprise a compiled, executable HDL simulation model that functionally simulates the devices shown in FIGS. 1, 3, 5 and 6.

Design structure 890 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 3, 5 and 6. Design structure 890 may then proceed to a stage 895 where, for example, design structure 890: proceeds to tape-out, is released to manufacturing, is released to a mask house, is sent to another design house, is sent back to the customer, etc.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A charge sharing circuit for generating a calibration voltage, the circuit comprising:
    a calibration capacitor for providing at an upper terminal of the calibration capacitor the calibration voltage;
    a series connection of a plurality of N switches, wherein N is an integer>2;
    a plurality of at least N−1 switching capacitors, each switching capacitor being coupled to one connecting node connecting two of the N switches;
wherein
    one side of the series connection of the plurality of N switches is coupled to the upper terminal of the calibration capacitor and the other side of the series connection of the N switches is coupled to a fixed voltage; and
    the circuit is configured to transmit at least two clock signals to selectively drive at least two distinct subsets of the switches.

2. A circuit according to claim 1, wherein the at least two clock signals are non-overlapping.

3. A circuit according to claim 1, further configured to generate a first one of the clock signals to drive each of the 2n+1-th switches, n=0, Floor[(N−1)/2], and a second one of the clock signals to drive each of the 2n-th switches, n=1, Ceiling[(N−1)/2].

4. A circuit according to claim 1, further configured to generate N clock signals and to transmit to each of the N switches one of the N clock signals.

5. A circuit according to claim 1, wherein each subset consists of one single switch.

6. A circuit according to claim 1, wherein each subset comprises at least two switches.

7. A circuit according to claim 1, wherein the circuit is configured to constantly close one or more of the switches and to transmit at least two non-overlapping clock signals to selectively drive at least two distinct subsets of the remaining non-constantly closed switches.

8. A circuit according to claim 1, wherein
    a lower terminal of the calibration capacitor is coupled to a fixed voltage;
    one terminal of each of the switching capacitors is coupled to one connection node of the switches; and
    the other terminal of each of the switching capacitors is coupled to a fixed voltage.

9. A circuit according to claim 1, wherein the switching capacitors are parasitic capacitors of the switches.

10. A circuit according to claim 1, wherein the switching capacitors are separate capacitors.

11. A circuit according to claim 1, wherein the granularity $\Delta V_{cal}$ of the calibration voltage provided by the circuit is given by $$\Delta Vcal = Vcal \frac{Cswitch}{Ccal*(N-1)}$$

wherein Vcal is the calibration voltage, Cswitch is the capacitance of the switching capacitors and Ccal is the capacitance of the calibration capacitor.

12. A circuit according to claim 1, wherein the switches are selected from the group of: PMOS transistors; NMOS transistors and transmission gates comprising a parallel arrangement of a NMOS transistor and a PMOS transistor.

13. A circuit according to claim 1, wherein one or more of the switches are transmission gates comprising a parallel arrangement of a NMOS transistor and a PMOS transistor and wherein the clock signals for driving the NMOS transistor and the PMOS transistor are skewed.

14. A circuit according to claim 1, wherein the other side of the series connection is coupled to ground as fixed voltage.

15. A circuit according to claim 1, wherein the other side of the series connection is coupled to a supply voltage as fixed voltage.

16. A circuit according to claim 1, comprising
a first series connection of a plurality of first switches and a plurality of at least N−1 first switching capacitors, each first switching capacitor being coupled to one connecting node connecting two of the first N switches; and
a second series connection of a plurality of second switches and a plurality of at least N−1 second switching capacitors, each second switching capacitor being coupled to one connecting node connecting two of the second N switches;
wherein the first series connection is coupled to a first fixed voltage and the second series connection is coupled to a second fixed voltage.

17. A circuit according to claim 16, wherein the first fixed voltage is ground and the second fixed voltage is a supply voltage.

18. A comparator comprising a circuit according to claim 1, the circuit being provided for providing as calibration voltage an offset compensation voltage to the comparator.

19. A successive approximation register analog to digital converter (SAR ADC) comprising a circuit according to claim 1, the circuit being provided for providing as calibration voltage a reference voltage to a digital to analog converter (DAC) of the SAR ADC.

20. A method for generating a calibration voltage, the method comprising
providing a charge sharing circuit, the circuit comprising
a calibration capacitor;
a series connection of a plurality of N switches, wherein N is an integer>2;
a plurality of N−1 switching capacitors, each switching capacitor being coupled to one connecting node connecting two of the N switches; wherein
one side of the series connection of the plurality of N switches is coupled to an upper terminal of the calibration capacitor and the other side of the series connection of the N switches is coupled to a fixed voltage;
transmitting at least two clock signals to selectively drive at least two distinct subsets of the switches; and
providing, by the calibration capacitor, the calibration voltage at the upper terminal of the calibration capacitor.

21. A method according to claim 20, wherein the at least two clock signals are non-overlapping.

22. A method according to claim 20, comprising generating the clock signals to be transmitted to drive the two distinct subsets of the switches.

23. A method according to claim 20, further comprising generating a first one of the clock signals to drive each of the 2n+1-th switches, n=0, Floor[(N−1)/2], and a second one of the clock signals to drive each of the 2n-th switches, n=1, Ceiling [(N−1)/2].

24. A method according to claim 20, comprising
generating N non-overlapping clock signals;
transmitting to each of the N switches one of the N non-overlapping clock signals.

25. A design structure tangibly embodied in a machine readable medium for designing, manufacturing, or testing an integrated circuit, the design structure comprising a charge sharing circuit for generating a calibration voltage, the circuit comprising:
a calibration capacitor for providing at an upper terminal of the calibration capacitor the calibration voltage;
a series connection of a plurality of N switches, wherein N is an integer>2;
a plurality of at least N−1 switching capacitors, each switching capacitor being coupled to one connecting node connecting two of the N switches;
wherein
one side of the series connection of the plurality of N switches is coupled to the upper terminal of the calibration capacitor and the other side of the series connection of the N switches is coupled to a fixed voltage; and
the circuit is configured to transmit at least two non-overlapping clock signals to selectively drive at least two distinct subsets of the switches.

* * * * *